United States Patent
Peng et al.

(10) Patent No.: US 9,282,592 B2
(45) Date of Patent: Mar. 8, 2016

(54) ROTATABLE HEATING-COOLING PLATE AND ELEMENT IN PROXIMITY THERETO

(75) Inventors: Jui-Chun Peng, Hsin-Chu (TW); Jacky Chung, Hsinchu (TW); Heng-Hsin Liu, Yonghe (TW); Chun-Hung Lin, Taoyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1129 days.

(21) Appl. No.: 12/686,276

(22) Filed: Jan. 12, 2010

(65) Prior Publication Data

US 2010/0219175 A1 Sep. 2, 2010

Related U.S. Application Data

(60) Provisional application No. 61/156,314, filed on Feb. 27, 2009.

(51) Int. Cl.
| | |
|---|---|
| *H05B 3/68* | (2006.01) |
| *H01L 21/67* | (2006.01) |
| *H01L 21/68* | (2006.01) |
| *H05B 3/14* | (2006.01) |
| *H05B 1/02* | (2006.01) |

(52) U.S. Cl.
CPC ............ *H05B 3/68* (2013.01); *H01L 21/67098* (2013.01); *H01L 21/67103* (2013.01); *H01L 21/67115* (2013.01); *H01L 21/67132* (2013.01); *H01L 21/67259* (2013.01); *H01L 21/681* (2013.01); *H05B 1/0233* (2013.01); *H05B 3/143* (2013.01); *H05B 3/148* (2013.01)

(58) Field of Classification Search
CPC ............ H01L 21/67132; H01L 21/681; H01L 21/67103; H01L 21/67098; H01L 21/67259; H01L 21/67115; H05B 3/143; H05B 3/148; H05B 1/0233
USPC .......................................................... 392/418
See application file for complete search history.

(56) References Cited

U.S. PATENT DOCUMENTS

| | | | | |
|---|---|---|---|---|
| 6,575,737 | B1 * | 6/2003 | Perlov et al. ..................... | 432/81 |
| 6,753,508 | B2 * | 6/2004 | Shirakawa ................. | 219/444.1 |
| 7,780,438 | B2 * | 8/2010 | Hayashi et al. ................. | 432/81 |
| 8,314,371 | B2 * | 11/2012 | Sorabji et al. .............. | 219/446.1 |
| 2001/0013515 | A1 * | 8/2001 | Harada et al. ................. | 219/390 |
| 2007/0084832 | A1 * | 4/2007 | Wirth et al. ................. | 219/69.12 |
| 2008/0156785 | A1 * | 7/2008 | Ookura et al. ................ | 219/162 |
| 2008/0230534 | A1 * | 9/2008 | Winkler et al. ............... | 219/390 |
| 2008/0280453 | A1 * | 11/2008 | Koelmel et al. ............... | 438/758 |
| 2009/0286407 | A1 * | 11/2009 | Yang ............................. | 438/795 |

\* cited by examiner

*Primary Examiner* — Savitr Mulpuri
(74) *Attorney, Agent, or Firm* — Hauptman Ham, LLP

(57) ABSTRACT

An apparatus for selectively heating/cooling one or more substrates and establishing an approximately uniform temperature in the one or more substrates during a heating or cooling event is described. In one embodiment, the apparatus comprises a rotatable hot/cold plate onto which the one or more substrates are placed and a heating/cooling element disposed in close proximity to the rotatable hot/cold plate for selectively elevating/lowering the temperature of the one or more substrates.

20 Claims, 3 Drawing Sheets

ROTATABLE HEATING-COOLING PLATE AND ELEMENT IN PROXIMITY THERETO

CROSS-REFERENCES TO RELATED APPLICATIONS

The present application is based on, and claims priority from, U.S. Provisional No. 61/156,314 filed Feb. 27, 2009, the disclosure of which is hereby incorporated by reference herein in its entirety.

BACKGROUND

The disclosure relates generally to a hot/cold plate apparatus, and more particularly, to a hot/cold plate apparatus for improving the critical dimension uniformity of a substrate.

Controlling the critical dimension (CD) uniformity is becoming ever more important in integrated circuit manufacturing processes, particularly during photolithography processes as line widths of resist patterns fall within the deep sub-micron range. Various processing parameters, for example, the amount of exposure to light, developing time, and heating temperatures, affect the critical dimension uniformity.

In a lithography process, which typically includes one or more heating steps both before (pre-exposure heating) and after (post-exposure heating) the exposure step, the wafer or substrate is typically placed on or proximate to a hot plate, which includes several (often up to ten) individual heating elements for producing heat at various locations in the hot plate. The heat experienced by the photoresist layer formed over the substrate, however, is not always uniform. This non-uniform temperature distribution may be caused by various factors, for example, the distance the heat energy must travel through each media (e.g., from heating element to the top surface of the hot plate), and the condition of the hot plate surface (e.g., uniformly flat or smooth). The non-uniform temperature distribution across the photoresist layer may lead to localized variations in critical dimensions (e.g., profile shape and line and space width of the photoresist pattern), which may lead to low device yields.

Just as important as the uniform temperature distribution is for a substrate during a heating event, the temperature distribution across the substrate should be sufficiently uniform during a cooling event in order to prevent damage to the substrate such as warpage or cracking.

For these reasons and other reasons that will become apparent upon reading the following detailed description, there is a need for an improved hot/cold plate apparatus and method for uniformly heating/cooling a substrate that avoids the critical dimension uniformity issue associated with conventional hot/cold plates.

SUMMARY

In accordance with one or more embodiments, an apparatus for selectively heating/cooling one or more substrates and establishing an approximately uniform temperature distribution in the one or more substrates during a heating or cooling event comprises: a rotatable hot/cold plate onto which the one or more substrates are placed; and a heating/cooling element disposed in close proximity to the rotatable hot/cold plate for selectively elevating/lowering the temperature of the one or more substrates.

In accordance with one or more embodiments, an apparatus comprises: a hot/cold plate onto which the one or more substrates are placed thereover; means for rotating the one or more substrates; and means for selectively heating/cooling the one or more substrates, the heating/cooling means disposed proximal to the hot/cold plate.

In accordance with one or more embodiments, an apparatus comprises: a hot/cold plate having a first surface for receiving a first substrate and a second surface for receiving a second substrate; means for rotating the hot/cold plate, the rotating means connected to the hot/cold plate; and means for selectively heating/cooling the first and second substrates, the heating/cooling means disposed proximal to the hot/cold plate.

In accordance with one or more embodiments, an apparatus comprises: a hot/cold plate having a first surface for receiving a first substrate and a second surface for receiving a second substrate; means for rotating the first and second substrates; and means for selectively heating/cooling the first and second substrates, the heating/cooling means disposed proximal to the hot/cold plate.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
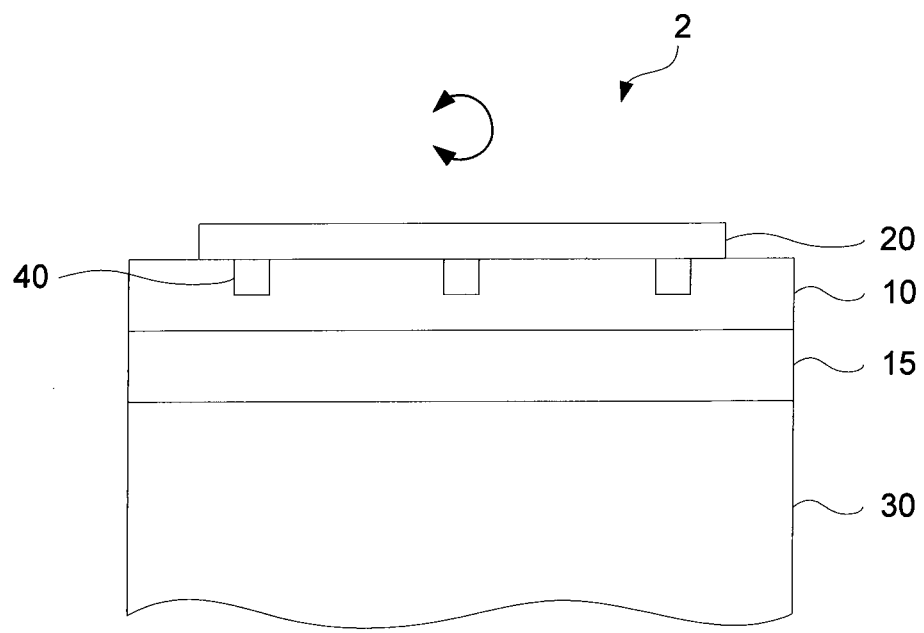
FIG. 1 is a cross-sectional view of a hot/cold plate apparatus according to one embodiment of the present invention.

FIG. 1 is a cross-sectional view of a hot/cold plate apparatus 2 according to one embodiment of the present invention. The hot/cold plate apparatus 2 includes a hot/cold plate 10 onto which a substrate 20 is placed. The substrate 20 may be a semiconductor substrate, a photomask blank, or other types of substrates that may be supported and heated/cooled. The hot/cold plate 10 may be an aluminum plate, a copper plate, a metal alloy plate, a ceramic plate, or a plate made out of a material capable of conducting thermal energy. The hot/cold plate 10 may also include a protective coating thereover comprising quartz, sapphire, aluminum oxide, or boron nitride, for example. Depending on the configuration of the substrate 20 being heated or cooled and the heating/cooling source used for heating/cooling, the hot/cold plate 10 may have various configurations such as a rectangle, a ellipse, a circle, etc. In one exemplary embodiment of the present disclosure, the hot/cold plate 10 is disc-shaped having a thickness of from about 0.5 mm to about 3 mm and a diameter of about 340 mm to accommodate a wafer having a thickness of 750 μm and a diameter from about 300 mm to about 340 mm. As is understood by those skilled in the art, the thickness of the hot/cold plate depends on the diameter and thickness of the particular wafer to be placed thereon for processing.

A heating/cooling element 30 provides heating or cooling to the hot/cold plate 10, which in turn provides heating/cooling to the substrate 20. As is shown in FIG. 1, the heating/cooling element 30 is positioned below the hot/cold plate 10. In one embodiment, the heating/cooling element 30 may be concentric or spiral in shape and attached to the underside of the hot/cold plate 10. However, in other embodiments, the heating/cooling element 30 may be disposed proximal to the hot/cold plate 10 such as being embedded within the hot/cold plate 10.

A controller (not shown) activates a voltage source (not shown) to allow a current to flow through a power line into the heating/cooling element 30. The current flowing through the heating/cooling element 30 is converted to heat that is transferred to the hot/cold plate 10 and the substrate 20 is thereafter heated. The heating continues for a pre-determined time (e.g., until the photosensitive resin on the substrate is sufficiently dried), after which the heating/cooling elements 30 are de-energized.

In the event that cooling a substrate is desired, the hot/cold plate 10 may include one or more conduits (not shown) in the hot/cold plate 10 for transporting cooling fluid such as water or gas therethrough to generally provide cooling to the substrate 20. The gas may include, for example, one or more of substantially thermally conductive and thermally non-conductive gases, such as helium, argon, and nitrogen. It is understood that alternative heating/cooling structures and/or sources may be employed within the teachings of the present disclosure without departing from its broader scope and spirit.

With reference still to FIG. 1, the hot/cold plate 10 may also include one or more temperature sensors 40. Temperature sensors 40 may be embedded in or bonded to the hot/cold plate in one embodiment and may comprise one or more pyrometric sensors or one or more fiber-optic sensors, for example. Temperature sensors 40 are operable to measure one or more temperatures at one or more respective locations associated with a substrate or a plurality of substrates. Each of the temperature sensors 40 may also employ a relay signal to the controller (not shown). The controller is operable to control the amount of heating or cooling to the hot/cold plate 10 by controlling a voltage source (not shown) or a tunable gas source (not shown), for example, at least in part on the signals associated with the one or more measured temperatures from the temperature sensors 40. For example, where uneven heating is detected by a particular temperature sensor at a particular location on the substrate 20, the controller may control the voltage source (not shown) to allow more current to flow through a power line into the heating/cooling element 30. The current flowing through the heating/cooling element 30 is converted to heat that is then transferred to the hot/cold plate 10.

To reduce the critical dimension (CD) uniformity error typically resulting from the non-uniform temperature distribution of a substrate and avoid hot/cold spots on the substrate surface, an aspect of the present disclosure provides that the substrate 20 be rotated about an axis to provide an approximately uniform temperature distribution across its surface during a heating or cooling event. As shown in FIG. 1, by coupling the hot/cold plate 10 to a rotating element 15, a source of rotation is provided to the substrate 20. The rotating element 15 is operable to rotate hot/cold plate 10 bi-directionally and may comprise, for example, 1) a drive shaft driven by an electric motor, an electromechanical drive motor, or a pneumatic motor, or 2) the drive shaft and a gear assembly, operable to translate rotation to the hot/cold plate 10.

Figure 2:
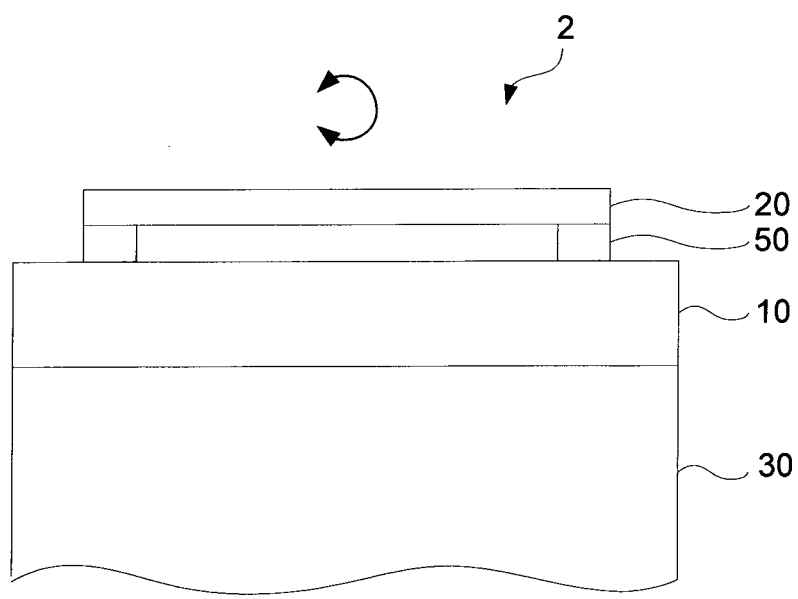
FIG. 2 is a cross-sectional view of a hot/cold plate apparatus, according to another embodiment of the present invention.
Figure 3:
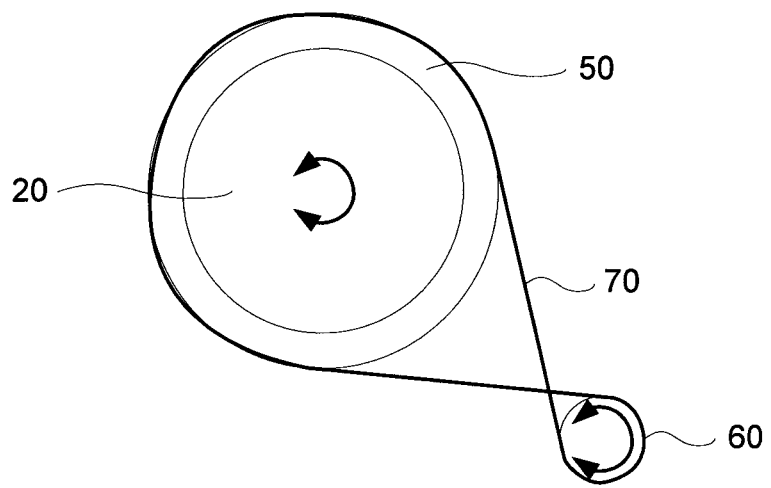
FIG. 3 is a top view of a gear apparatus for imparting rotation to a substrate, according to one embodiment of the present invention.

Alternatively, the substrate 20 itself may be rotated bi-directionally by a ring type holder 50 in a hot/cold plate apparatus, as illustrated in FIG. 2. The ring type holder 50 is operably coupled to a gear or pulley mechanism that imparts rotation to the ring type holder 50. FIG. 3 shows a top view of the ring type holder 50 gear apparatus, according to one embodiment of the present invention. The ring type holder 50 is positioned below and generally coaxially with the substrate 20 having a diameter proximate to the diameter of the substrate 20, wherein the ring type holder 50 is operable to radially constrain the substrate 20. A motor 60 imparts rotational energy to the ring type holder 50 via a pulley belt 70, which then rotates the substrate 20.

Figure 4:
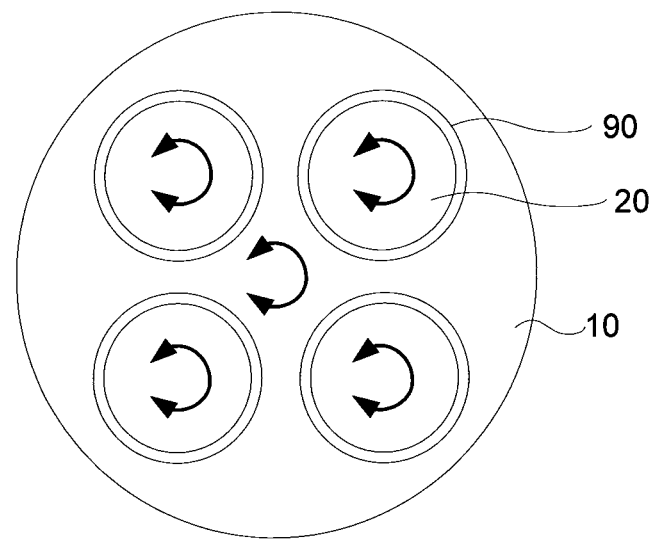
FIG. 4 is a top view of a hot/cold plate having a plurality of sub-plates thereon, according to one embodiment of the present invention.

As shown in FIG. 4, a top-down view, the rotatable hot/cold plate 10 may include one or more sub-plates 90 for receiving one or more substrates 20. Rotational means engageably couples to the hot/cold plate to ensure that each of the plurality of sub-plates 90 rotates bi-directionally. Each sub-plate 90 may be rotating independently whilst the hot/cold plate 10 may be rotating or not.

According to one embodiment of the present invention, the ring type holder 50 may include one or more sub-plates 90, the sub-plates being capable of rotating bi-directionally. Those skilled in the art understands that alternative sources for rotating a substrate or a plurality of substrates disposed in sub-plates may be employed within the teachings of the present disclosure without departing from its broader spirit and scope.

Figure 5:
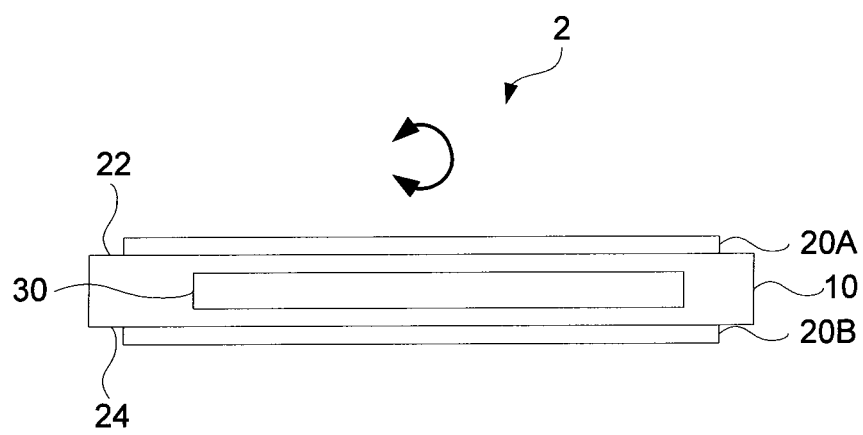
FIG. 5 is a cross-sectional view of a hot/cold plate apparatus for affixing one or more substrates over the surfaces of the hot/cold plate, according to one embodiment of the present invention.

FIG. 5 is a cross-sectional view of a portion of a hot/cold plate apparatus 2 for affixing one or more substrates over the surfaces of the hot/cold plate 10, according to one embodiment of the present invention. By having two or more substrates rotate at the same time during a heating or cooling event, the cycle time can be reduced. In one embodiment, the hot/cold plate 10 has a first surface 22 for receiving a first substrate 20A and a second surface 24 for receiving a second substrate 20B. In another embodiment, the first surface 22 of the hot/cold plate 10 includes one or more sub-plates for receiving one or more substrates and the second surface 24 includes one or more sub-plates for receiving one or more substrates. In another embodiment, the hot/cold plate apparatus 2 includes a robot mechanism (not shown) operable to position and remove substrates from the hot/cold plate 10. In yet another embodiment, the hot/cold plate apparatus 2 includes a ring type holder (not shown) disposed on the first and the second surfaces 22 and 24, each for receiving the first substrate 20A and the second substrate 20B, respectively each ring type holder operably coupled to a gear or pulley mechanism for imparting rotation to the ring type holders. In another embodiment, each ring type holder of the hot/cold plate apparatus 10 includes one or more sub-plates for receiving one or more substrates.

Aspects of the present disclosure provide several advantages. In a heating event, by controlling the temperature distribution of a wafer to be as uniform as possible, the critical dimension (CD) uniformity improves thereby improving the device yield. This temperature distribution uniformity may also reduce hot spots, which can occur in existing systems.

In a cooling event, by managing the temperature distribution of a wafer to be as uniform as possible, possible damage to the wafer such as warpage or cracking can be avoided.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. An apparatus for selectively heating or cooling one or more substrates and establishing an approximately uniform temperature distribution in the one or more substrates during a heating or cooling event, the apparatus comprising:
    a rotatable hot-cold plate onto which the one or more substrates are placed, wherein the rotatable hot-cold plate comprises a plurality of sub-plates for receiving the one or more substrates, and each sub-plate of the plurality of sub-plates is independently rotatable bi-directionally; and
    a heating-cooling element disposed in close proximity to the rotatable hot-cold plate for selectively elevating or lowering the temperature of the one or more substrates, wherein the rotatable hot-cold plate is configured to rotate relative to the heating-cooling element.

2. The apparatus of claim 1, further comprising one or more temperature sensors operable to measure one or more temperatures at one or more respective locations associated with the one or more substrates.

3. An apparatus for selectively heating or cooling one or more substrates and establishing an approximately uniform temperature distribution in the one or more substrates during a heating or cooling event, the apparatus comprising:
    a hot-cold plate, the hot-cold plate having a surface configured to support the one or more substrates, wherein the hot-cold plate comprises a plurality sub-plates;
    means for rotating the hot-cold plate, the rotating means connected to the hot-cold plate; and
    means for selectively heating or cooling the one or more substrates, the heating or cooling means disposed proximal to the hot-cold plate, wherein the means for selectively heating or cooling are on a same side of the surface of the hot-cold plate, and
    the means for rotating the hot-cold plate is configured to rotate at least one of the plurality of sub-plates relative to the means for selectively heating or cooling, wherein the means for rotating the hot-cold plate is configured to independently rotate each sub-plate of the plurality of sub-plates.

4. The apparatus of claim 3, wherein the sub-plates are rotatable bi-directionally.

5. The apparatus of claim 3, wherein the means for rotating the hot-cold plate comprises a motor, a drive shaft driven by the motor, and a gear assembly connected with the drive shaft and with the hot-cold plate operable to translate rotation to the hot-cold plate.

6. The apparatus of claim 3, further comprising one or more temperature sensors operable to measure one or more temperatures at one or more respective locations associated with the one or more substrates.

7. An apparatus for selectively heating or cooling one or more substrates and establishing an approximately uniform temperature distribution in the one or more substrates during a heating or cooling event, the apparatus comprising:
    a hot-cold plate configured to support the one or more substrates, wherein the hot-cold plate comprises a plurality of sub-plates;
    means for rotating the one or more substrates, wherein the means for rotating the one or more substrates is configured to independently rotate each sub-plate of the plurality of sub-plates; and
    means for selectively heating or cooling the one or more substrates, the heating or cooling means disposed proximal to the hot-cold plate, wherein the means for selectively heating or cooling is a single unit.

8. The apparatus of claim 7, wherein the means for rotating the one or more substrates comprises a ring-type holder for receiving the one or more substrates, the ring-type holder operably coupled to a gear or pulley mechanism to impart rotation to the ring-type holder.

9. The apparatus of claim 8, wherein the ring-type holder comprises one or more sub-plates for receiving the one or more substrates, the sub-plates rotatable bi-directionally.

10. The apparatus of claim 7, further comprising one or more temperature sensors operable to measure one or more temperatures at one or more respective locations associated with the one or more substrates.

11. An apparatus for selectively heating or cooling at least two substrates and establishing an approximately uniform temperature distribution in the at least two substrates during a heating or cooling event, the apparatus comprising:
    a hot-cold plate having a first surface for receiving a first substrate and a second surface for receiving a second substrate, wherein the first surface of the hot-cold plate comprises a plurality of sub-plates for receiving one or more substrates;
    means for rotating the hot-cold plate, the rotating means connected to the hot-cold plate, wherein the means for rotating the hot-cold plate is configured to independently rotate each sub-plate of the plurality of sub-plates; and
    means for selectively heating or cooling the first and second substrates, the heating or cooling means disposed proximal to the hot-cold plate, wherein the hot-cold plate is rotatable relative to the means for selectively heating or cooling.

12. The apparatus of claim 11, wherein the second surface of the hot-cold plate comprises one or more sub-plates for receiving one or more substrates.

13. The apparatus of claim 11, wherein the means for rotating the hot-cold plate comprises a motor, a drive shaft driven by the motor, and a gear assembly connected with the drive shaft and with the hot-cold plate operable to translate rotation to the hot-cold plate.

14. The apparatus of claim 11, further comprising a robot mechanism operable to position substrates on the hot-cold plate and to remove substrates from the hot-cold plate.

15. The apparatus of claim 11, further comprising one or more temperature sensors operable to measure one or more temperatures at one or more respective locations associated with the at least two substrates.

16. An apparatus for selectively heating or cooling at least two substrates and establishing an approximately uniform temperature distribution in the at least two substrates during a heating or cooling event, the apparatus comprising:
- a hot-cold plate having a first surface for receiving a first substrate and a second surface for receiving a second substrate;
- means for rotating the first and second substrates; and
- means for selectively heating or cooling the first and second substrates, the heating or cooling means disposed proximal to the hot-cold plate, wherein the means for selectively heating or cooling are between the first surface and the second surface, and the means for rotating the first and second substrate is configured to rotate the first and second substrates relative to the means for selectively heating or cooling, wherein the means for rotating the first and second substrates further comprises a ring-type holder for receiving the first and second substrates, and the ring-type holder comprises a plurality of sub-plates for receiving one or more substrates, the sub-plates rotatable bi-directionally,
- wherein the means for rotating the first and second substrates is configured to independently rotate each sub-plate of the plurality of sub-plates.

17. The apparatus of claim 16, further comprising a robot mechanism operable to position substrate on the hot-cold plate and to remove substrates from the hot-cold plate.

18. The apparatus of claim 16, wherein the ring-type holder operably coupled to a gear or pulley mechanism to impart rotation to the ring-type holder.

19. The apparatus of claim 16, further comprising one or more temperature sensors operable to measure one or more temperatures at one or more respective locations associated with the at least two substrates.

20. An apparatus for selectively heating or cooling one or more substrates and establishing an approximately uniform temperature distribution in the one or more substrates during a heating or cooling event, the apparatus comprising:
- a hot-cold plate onto which the one or more substrates are placed, the hot-cold plate comprising:
  - a plurality of sub-plate for receiving one or more substrates, each of the plurality of sub-plates being independently rotatable;
- means for rotating the hot-cold plate, the rotating means connected to the hot-cold plate;
- means for independently rotating each of the plurality of sub-plates connected to a corresponding sub-plate of the plurality of sub-plates; and
- means for selectively heating or cooling the one or more substrates, the heating or cooling means disposed proximal to the hot-cold plate, wherein the means for selectively heating or cooling is a single unit.

* * * * *